United States Patent
Lippincott

(10) Patent No.: US 6,857,109 B2
(45) Date of Patent: Feb. 15, 2005

(54) SHORT EDGE SMOOTHING FOR ENHANCED SCATTER BAR PLACEMENT

(76) Inventor: George P. Lippincott, 16711 Gary La., Lake Oswego, OR (US) 97034

( * ) Notice: Subject to any disclaimer, the term of this patent is extended or adjusted under 35 U.S.C. 154(b) by 223 days.

(21) Appl. No.: 10/273,731

(22) Filed: Oct. 18, 2002

(65) Prior Publication Data

US 2004/0078763 A1 Apr. 22, 2004

(51) Int. Cl.$^7$ .............................................. G06F 17/50
(52) U.S. Cl. ............................................ 716/2; 716/21
(58) Field of Search ....................................... 716/2, 21

(56) References Cited

U.S. PATENT DOCUMENTS

| | | |
|---|---|---|
| 5,502,654 A | 3/1996 | Sawahata |
| 5,655,110 A | 8/1997 | Krivokapic et al. |
| 5,723,233 A | 3/1998 | Garza et al. |
| 5,825,647 A | 10/1998 | Tsudaka |
| 5,879,844 A | 3/1999 | Yamamoto et al. |
| 6,016,357 A | 1/2000 | Neary et al. |
| 6,049,660 A | 4/2000 | Ahn et al. |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,311,319 B1 * | 10/2001 | Tu et al. ........................ 716/19 |
| 6,335,130 B1 * | 1/2002 | Chen et al. ..................... 430/5 |
| 6,370,679 B1 | 4/2002 | Chang et al. |
| 6,425,117 B1 | 7/2002 | Pasch et al. |
| 6,453,452 B1 | 9/2002 | Chang et al. |
| 6,453,457 B1 | 9/2002 | Pierrat et al. |
| 6,467,076 B1 | 10/2002 | Cobb |
| 6,499,003 B2 | 12/2002 | Jones et al. |

FOREIGN PATENT DOCUMENTS

| | | |
|---|---|---|
| JP | 09319067 A | 12/1996 |
| WO | WO 01/65315 A2 | 9/2001 |

OTHER PUBLICATIONS

Cobb, N., and Y. Granik, "Model–Based OPC Using the MEEF Matrix," *Proceedings of SPIE, vol. 4889: 22nd Annual BACUS Symposium on Photomask Technology*, Monterey, Calif., Sep. 30–Oct. 4, 2002, p. 147.

(List continued on next page.)

*Primary Examiner*—Stacy A. Whitmore
(74) *Attorney, Agent, or Firm*—Christensen O'Connor Johnson Kindness PLLC

(57) ABSTRACT

An edge-smoothing process identifies a target edge fragment among a number of edge fragments that form a feature in a photolithographic design. Each of the edge fragments has a length and a classification. The length of the target edge fragment is less than a minimum scatter bar length. The target edge fragment is also classified so that it will receive a scatter bar, and the target edge fragment has a collinear edge fragment. The target edge fragment is smoothed in conjunction with the collinear edge fragment to increase the length of the target edge fragment.

55 Claims, 16 Drawing Sheets

OTHER PUBLICATIONS

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 10–14, 1997, pp. 458–468.

Cobb, N., and A. Zakhor, "Fast, Low–Complexity Mask Design," *Proceedings of SPIE, vol. 2440: Symposium on Optical/Laser Microlithography VIII*, Santa Clara, Calif., Feb. 22–24, 1995, pp. 313–327.

Cobb, N., and A. Zakhor, "Fast Sparse Aerial Image Calculation for OPC," *Proceedings of SPIE, vol. 2621: 15th Annual BACUS Symposium on Photomask Technology and Management*, Santa Clara, Calif., Sep. 20–22, 1995, pp. 534–545.

Cobb, N., and A. Zakhor, "Large Area Phase–Shift Mask Design," *Proceedings of SPIE, vol. 2197: Symposium on Optical/Laser Microlithography VII*, San Jose, Calif., Mar. 2–4, 1994, pp. 348–360.

Cobb., N., et al., "Mathematical and CAD Framework for Proximity Correction," *Proceedings of SPIE, vol. 2726: Symposium on Optical Microlithography IX*, Santa Clara, Calif., Mar. 13–15, 1996, pp. 208–222.

Cobb, N., and Y. Granik, "Using OPC to Optimize for Image Slope and Improve Process Window," (Nov. 20, 2002), *Proceedings of SPIE, vol. 5130: Photomask Japan*, Yokohama, Japan, Apr. 16–18, 2003, p. 42.

Granik, Y., "Generalized MEEF Theory," *Interface 2001*, Nov. 2001.

Granik, Y., and N. Cobb, "MEEF as a Matrix," *Proceedings of SPIE, vol. 4562: 21st Annual BACUS Symposium on Photomask Technology*, Monterey, Calif., Oct. 2–5, 2001, pp. 980–991.

Granik, Y., and N. Cobb, "Two–Dimensional G–MEEF Theory and Appplications," *Proceedings of SPIE, vol. 4754; Symposium on Photomask and Next–Generation Lithography Mask Technology IX*, Yokohama, Japan, Apr. 23–25, 2002, pp. 146–155.

Maurer, W., et al., "Process Proximity Correction Using an Automated Software Tool," *Proceedings of SPIE, vol. 3334: Optical Microlithography XI*, Santa Clara, Calif., Feb. 22–27, 1998, pp. 245–253.

Maurer, W., et al., "Evaluation of a Fast and Flexible OPC Package: OPTISSIMO," *Proceedings of SPIE, vol. 2884: 16th Annual Symposium on Photomask Technology and Management*, Redwood City, Calif., Sep. 18–20, 1996, pp. 412–418.

Ohnuma, H., et al., "Lithography Computer Aided Design Technology for Embedded Memory in Logic," *Japanese Journal of Applied Physics 37(12B)*:6686–6688, Dec. 1998.

* cited by examiner

SHORT EDGE SMOOTHING FOR ENHANCED SCATTER BAR PLACEMENT

FIELD OF THE INVENTION

The present invention pertains to the field of Resolution Enhancing Technologies (RET) in photolithography. More particularly, this invention relates to reducing the number of short edge fragments in a design to simplify subsequent scatter bar placement.

BACKGROUND OF THE INVENTION

Photolithography is used to transfer a design onto a surface. A light shines through a mask to project the design from the mask onto the surface. Then, various forms of chemical processing can be used to fix the projected design onto the surface, rather like developing film.

Photolithography is used for many different purposes. Most notably, however, photolithography is used for fabricating integrated circuits (ICs). In IC fabrication, a design usually includes a large number of geometric features, or shapes. An IC may include many layers of photolithographic designs built one on top of another. The geometric features of the various design layers are carefully arranged to form circuit elements, such as transistors, transmission paths, diodes, resistors, and the like.

Advances in photolithography continually provide smaller feature sizes, leading to increasingly more densely packed and more powerful ICs. The minimum feature size in masks has dropped below the wavelength of the light sources used to illuminate the masks. At these very small feature sizes, the behavior of the projected light becomes more complicated than at larger feature sizes. For instance, the edges of projected features may be obscured, corners may be rounded, line ends may be cut off, closely spaced features may bleed together, and small features may not appear at all.

Retical enhancing technologies (RETs) have been developed to compensate for the behavior of light at small feature sizes. "Retical" is another word for mask. RETs involve predicting or determining how light is likely to behave when used to project very small features from a mask, and enhancing the mask in some way to "pre-compensate" for the light's behavior.

One form of RET involves scatter bars, also referred to as assist bars, leveling bars, and sub-resolution assist features (SRAFs). Scatter bars are useful because photolithography is often optimized to provide the best resolution for closely spaced features. Put another way, features that are close together will often project more clearly than features that are farther apart in many photolithographic systems. In which case, scatter bars are added in masks along edges of more isolated features so that the edges project as if they were closely spaced. The scatter bars themselves are comparatively narrow so that they are too small to resolve. In other words, scatter bars do not appear in the projected image of a design, but the scatter bars improve the projection of other design features, as if the other features were closely spaced.

A number of different approaches can be used to assign scatter bars to particular edges. One approach that is often used is a rule-based approach that assigns scatter bars based on spacing classification. That is, all edges having a certain spacing classification in a design are assigned the same type of scatter bar enhancement. Spacing classification can be used to define whether or not an edge receives scatter bar enhancement at all, as well as the number of scatter bars, the spacing of scatter bars, and the width of scatter bars. The length of scatter bars is usually simply the same length as the edges to which the bars are assigned. Spacing classification and scatter bar enhancement parameters can all change depending on the photolithographic process being used, design constraints, designer preference, and the like.

To determine spacing classifications for edges of features, one approach is to travel along the edges of features in a design in small increments and project perpendicularly out from the feature at each increment until another edge is encountered or a maximum distance is reached. Then, depending on the length of the perpendicular projection, a classification is assigned to the incremental section of the edge.

For instance, FIG. 1 illustrates a simple photolithographic design 100 including three features, 110, 120, and 130. Design 100 can be represented using many different forms of design data. One common form of design data is GDSII, in which each feature in a design is defined by a set of points in a two dimensional space. For instance, feature 110 could be defined in GDSII by four points 111, 112, 113, and 114, one point at each corner. In which case, pairs of points define the edges of feature 110, such as edge 115 between points 111 and 112.

Projecting perpendicularly out from any point along edge 115, no edge is encountered, so edge 115 is classified as an isolated edge. Similarly, the spacing classification for edges 116 and 117 is isolated. The edge between points 112 and 113, however, has different spacing at different points along the edge. In which case, one approach is to fragment the edge based on spacing and assign different spacing classifications to different edge fragments. In the illustrated embodiment, the edge between points 112 and 113 is fragmented into five sections, 118A, 118B, 118C, 118D, and 118E. Each pair of neighboring, collinear edge fragments along edge 118 has a different spacing classification. Edges 118A, 118C, and 118E are classified as isolated because no edges are encountered within the maximum projection distance, and edges 118B and 118D are classified as something closer than isolated because edges are encountered within the maximum projection distance.

For features 120 and 130, edges 125 and 134 will receive the same spacing classifications as edges 118B and 118D, respectively. Edges 121, 122, 126, 131, and 132 will each receive isolated spacing classifications. Edges between features 120 and 130 are consistently spaced over part of their lengths and diverge over the remainder. In which case, the edges will be fragmented as the spacings transition from one edge classification to the next. Specifically, in the illustrated embodiment, edge 133 is fragmented into eight fragments, 133A to 133H. Edge 123 is fragmented into five fragments, 123A to 123 E. Edges 124 and 133A will receive the same classifications. Edges 133B to 133H will receive incrementally more distant spacing classifications, as will edges 123A to 123E.

As used herein, the terms edge and edge fragment will be used interchangeable. Both edge and edge fragment refer in general to any part of a feature defined by two points, whether created by fragmentation from a longer edge or not. In other words, lines 115, 116, 117, and all five lines of 118 may each be interchangeably referred to herein as an edge or an edge fragment, even though edges 115, 116, and 117 where not fragmented.

FIG. 2 illustrates one embodiment of the design from FIG. 1 with scatter bars added. All of the isolated edge fragments in the illustrated design receive two scatter bars. The edge fragments having closer spacing classifications each receive one or two scatter bars, with each scatter bar placed at various distances from the respective edges depending on classification.

This type of rule-based application of scatter bars can lead to violations of design constraints. Design constraints include a minimum spacing between features and a minimum scatter bar length. If a scatter bar is too small, it may not be possible to create the physical scatter bar feature in the mask. If features are too close, they may bleed together in the projected image, possibly causing problems such as short circuits. In the particular case of scatter bars, scatter bars are not supposed to resolve in the projected image. But, if scatter bars merge together, or merge into other features, the combined features may be large enough to be visible, or resolve, in the projected image, possibly causing any number problems.

In the illustrated embodiment of FIG. 2, many scatter bars overlap, are very close to one another, and are shorter than the minimum scatter bar length 140. The problem areas tend to be concentrated in areas where fragmentation based on spacing created many small edge fragments, such as the at the bottoms of features 120 and 130, and the areas between features 120 and 130 where the features diverge from one another.

Therefore, after assigning scatter bars, a clean-up process is usually necessary to identify features having design constraint violations, sometimes referred to as "illegal" features, and to modify the features to meet the constraints. For instance, scatters bars that are too close to other features or overlap other features may be shortened, deleted, or merged. Clean-up tends to be complex and time consuming because spacing needs to be determined not just in a perpendicular projection from incremental points along edge fragments, but in multiple directions in a two dimensional plane from each incremental point along edge fragments. Then, when an illegal feature is found, the clean-up process needs to determine if the feature can be brought into compliance with design constraints, and, if so, how best to do so in a given situation.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION

Figure 1:
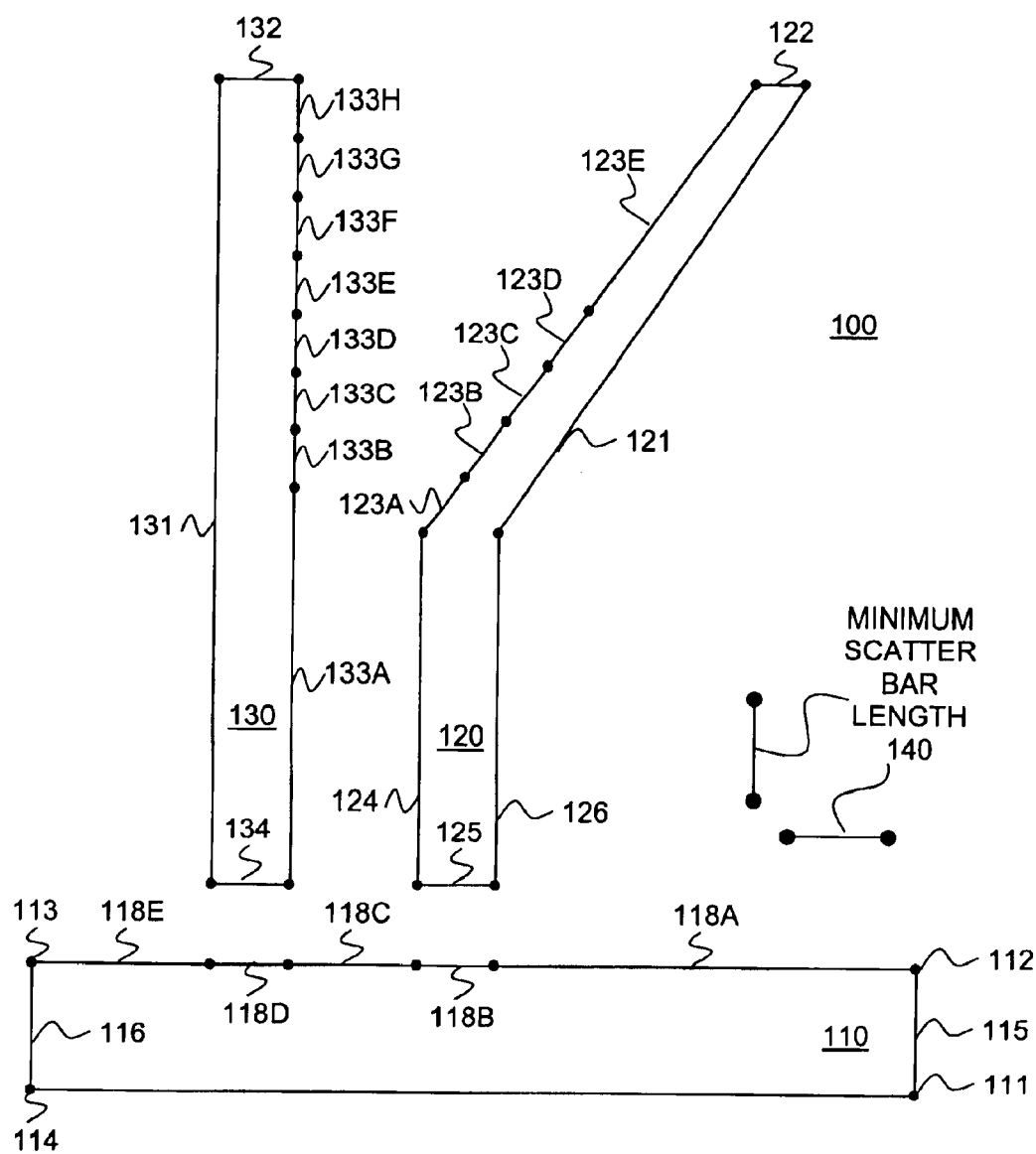
FIG. 1 illustrates an exemplary photolithographic design.

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful for understanding the present invention. However, the order of description should not be construed as to imply that these operations are necessarily performed in the order they are presented, nor even order dependent. Lastly, repeated usage of the phrase "in one embodiment" does not necessarily refer to the same embodiment, although it may.

Embodiments of the present invention operate on edge fragments in photolithographic designs to reduce the occurrence of scatter bars that are shorter than a minimum scatter bar length. By operating on edge fragments, embodiments of the present invention can be used before scatter bars are introduced into a design, as well as before any clean-up processing is done. With fewer short scatter bars, clean-up processing and scatter bar assignment can be significantly simplified.

Since scatter bars are usually the same length as the edge fragments to which they are assigned, embodiments of the present invention identify target edge fragments in a photolithographic design that 1) are shorter than a minimum scatter bar length, 2) have at least one neighboring, collinear edge fragment, and 3) are supposed to receive at least one scatter bar.

Then, embodiments of the present invention "smooth" these target edge fragments in conjunction with their collinear neighbors to increase the length of the target edge fragments. In one embodiment, a target edge fragment is lengthened by reducing the length of one or more neighboring, collinear edge fragments and adding that length to the target. In another embodiment, the target edge fragment is lengthened by merging the target edge fragment with one or more neighboring, collinear edge fragments into a single edge fragment.

In general, embodiments of the present invention work in one-dimensional space by calculating the lengths of straight edges. In contrast, clean-up processing works in two-dimensional space, dealing with separation among features. Two-dimensional processing tends to be much more complicated and time consuming than one-dimensional processing. In which case, by reducing the occurrence of scatter bars that are too short prior to clean-up processing, embodiments of the present invention provide a net efficiency improvement in many situations.

Figure 2:
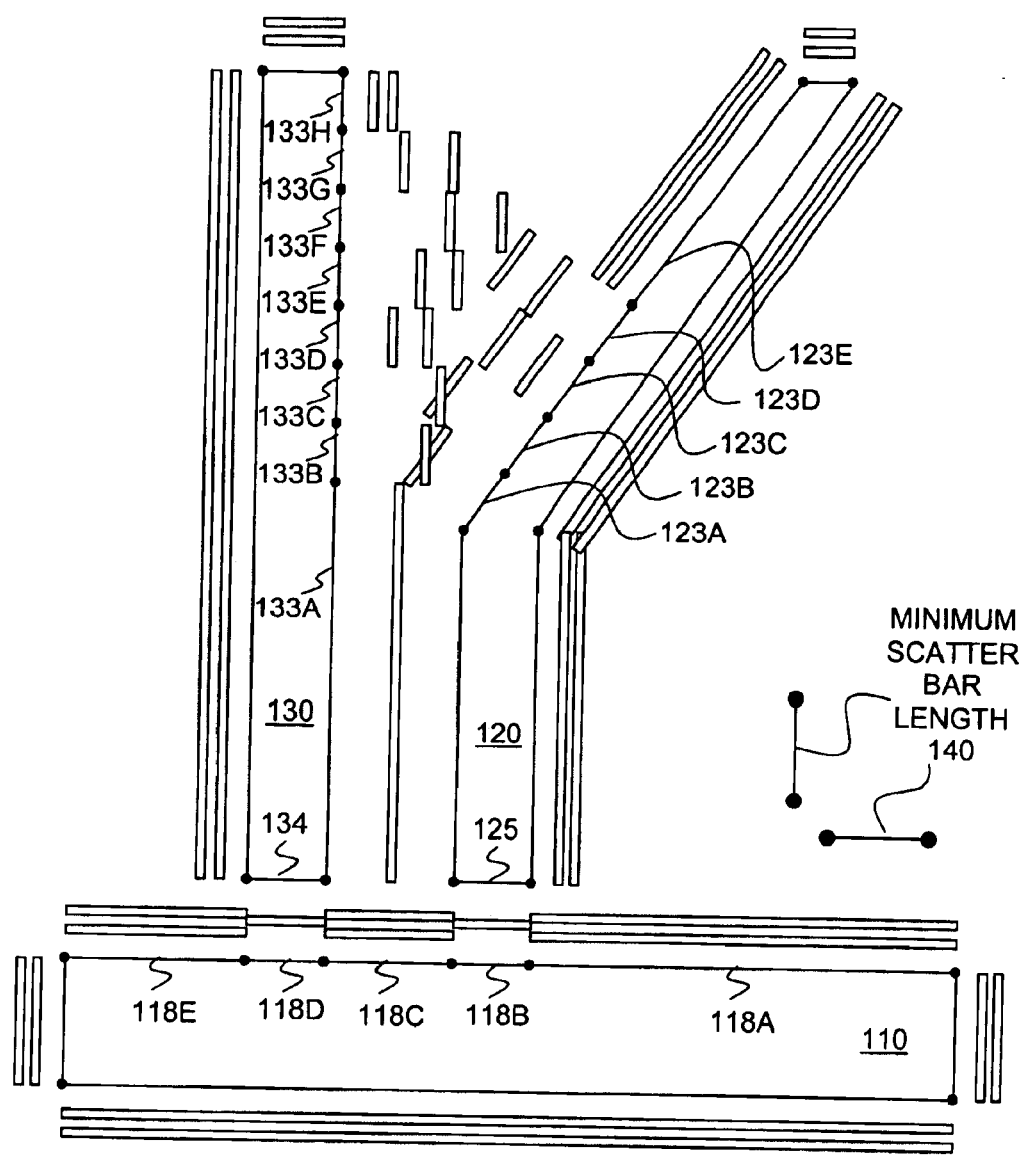
FIG. 2 illustrates the exemplary design modified with scatter bars.

Referring again to the embodiment of FIG. 1, design 100 has many edge fragments that are shorter than the minimum scatter bar length 140, including edge fragments 122, 125, 132, and 134. None of these four edge fragments have collinear, neighboring edge fragments with which to be smoothed, however, and are therefore not target edge fragments for purposes of the present invention. Edge fragments 118B, 118D, 133B through 133H, and 123A through 123D are target edge fragments in this example because they are each shorter than the minimum scatter bar length 140, they each have at least one collinear edge fragment with which to be smoothed, and, as seen in FIG. 2, they each have a classification to receive at least one scatter bar.

Figure 3:
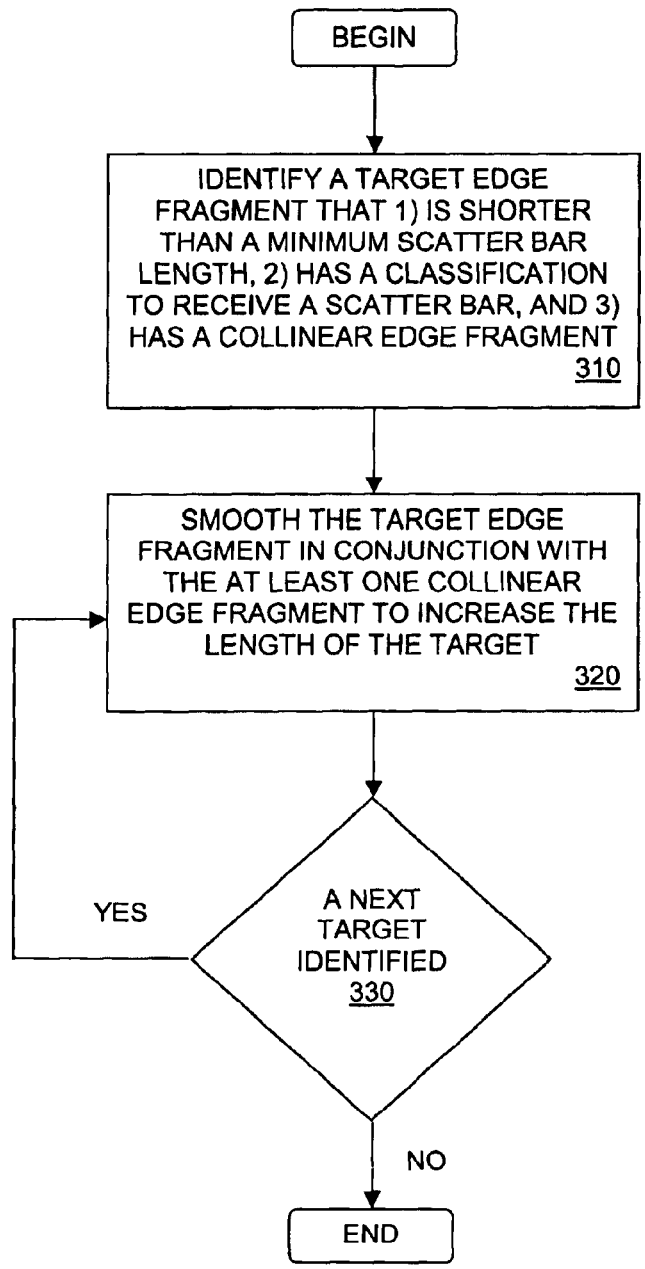
FIG. 3 demonstrates one embodiment of the present invention.

FIG. 3 demonstrates one embodiment of the present invention at a high level. Subsequent to edge fragmentation and edge classification, the illustrated embodiment identifies a target edge fragment at 310. The target edge is shorter than the minimum scatter bar length, has a collinear neighbor, and a classification to receive at least one scatter bar.

Any number of approaches can be used to filter edge fragments to find target edge fragments meeting this criteria. For instance, in GDSII data, one approach would be to scan through the data file in the order in which features are listed, identify an edge having a classification to receive at least one scatter bar, determine the length of the selected edge, compare the length to the minimum scatter bar length, and, if the length is less than the minimum length, check for at least one collinear neighbor. If any one of the criteria is not met, the process could proceed to the next edge in the GDSII file. Other approaches could analyze the criteria in different orders and/or different ways.

Once a target edge is identified, the target is smoothed in conjunction with at least one collinear neighbor to increase the length of the target at 320. As discussed below, the smoothing process can be done in many different ways depending on designer preference, the robustness of the photolithographic process to be used, the robustness of the smoothing algorithm being used, and the like. Of the variety of possible smoothing approaches, many smoothing approaches can be targeted to particular situations that may be, for instance, especially difficult to resolve in a given clean-up process. A variety of smoothing approaches can also be combined to deal with multiple situations and provide multiple solutions.

In FIG. 3, once the target edge has been smoothed, the illustrated embodiment checks at 330 to see if another target edge fragment is identified in the photolithographic design. If another target is identified, the process returns to 320 to smooth the next target edge fragment. If another target is not found in the design, the illustrated embodiment ends.

Figure 4:
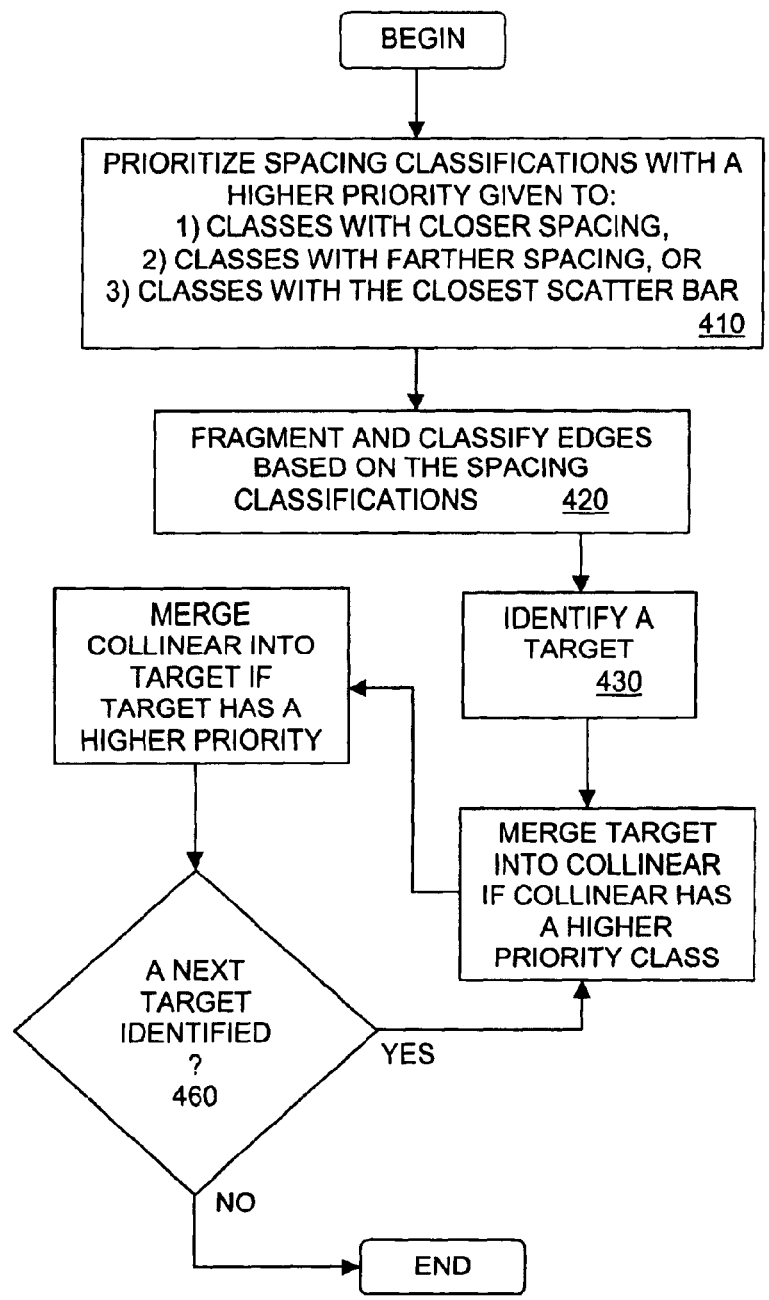
FIG. 4 demonstrates one embodiment of the present invention for priority-based merging.

FIG. 4 demonstrates one embodiment of the present invention using one of the many possible smoothing approaches. The illustrated process begins by prioritizing spacing classifications at 410. The spacing classifications can be prioritized in several ways. In the illustrated embodiment, three alternatives are provided, and a user may be given the opportunity to select from among the three. The first alternative gives a higher priority to less isolated classes, or classes having a closer spacing. The second alternative gives a higher priority to more isolated classes, or classes having a farther spacing. The third alternative gives a higher priority to classes having closer scatter bars.

The table below illustrates one example of spacing classifications and relative priority levels for each of the three alternative prioritization approaches.

| Spacing | Bars | Priority Approach #1 | Priority Approach #2 | Priority Approach #3 |
|---|---|---|---|---|
| <0.2 | None | No Priority | No Priority | No Priority |
| ≧0.2 and <0.4 | Center | 1 | 6 | 2 |
| ≧0.4 and <1.0 | 0.1 | 2 | 5 | 1 |
| ≧1.0 and <1.5 | 0.3 | 3 | 4 | 4 |
| ≧1.5 and <2.0 | 0.2, 0.5 | 4 | 3 | 3 |
| ≧2.0 and <2.5 | 0.5, 0.7 | 5 | 2 | 6 |
| ≧2.5 | 0.4, 0.6 | 6 | 1 | 5 |

The column labeled "Spacing" indicates how far a perpendicular projection reaches from an edge before encountering an obstacle. Each range of distances defines a spacing classification. The column labeled "Bars" indicates the type of scatter bar enhancement for each spacing classification. For instance, the closest spacing classification receives no scatter bar enhancement. The second classification receives one bar centered between the edge and the encountered obstacle. The third and fourth classifications receive one bar also, each bar at a spacing of 0.1 and 0.3, respectively. The fifth, sixth, and seventh classifications all receive two bars each.

Other embodiments may also include parameters to define the width of scatter bars for different classifications as well as different minimum scatter bar lengths for different classifications. In the case of different minimum scatter bar lengths for different classifications, a target edge fragment is identified based on the minimum scatter bar length for the target's particular classification.

The first prioritization approach assigns a higher priority to less isolated classifications that receive scatter bars. The second prioritization approach gives the highest priority to the most isolated classification, so it ranks the classes in the opposite order compared to the first approach. The third prioritization approach is based on the spacing of the scatter bars, so the priority order is quite different compared to the other two approaches. Selecting the best priority approach in a given circumstance is often simply a design choice.

Returning to the embodiment of FIG. 4, after prioritizing spacing classifications, the process fragments edges where needed and classifies the edges based on the spacing classifications at 420. At 430, the process identifies a target edge with a collinear neighbor. The target edge may actually have two collinear neighbors. Any number of approaches can be used to select one collinear neighbor for smoothing with the target edge. For instance, in one embodiment, a collinear neighbor is arbitrarily selected for smoothing based on the order in which the edges are listed in a data file describing the design. In another embodiment, selection priority is given to a collinear edge that also meets the criteria for being a target edge. Other embodiments may use other criteria, such as relative spacing classifications, relative lengths, and the like.

If the collinear neighbor for smoothing with the target edge has a higher priority classification than the target edge, the process merges the target edge into the collinear edge at 440 to form a single edge. In other words, by merging the target edge into the collinear edge, the target edge is eliminated and the collinear edge grows by the length of the target edge. The remaining edge has the edge classification of the original collinear edge.

If, instead, the target edge has a higher priority classification than the collinear edge, the process merges the collinear edge into the target edge at 450 to form a single edge. The single edge takes on the classification of the target edge. If another target edge is identified at 460, the process loops back to 440 to smooth the next target. Otherwise, the process ends.

Figure 5:
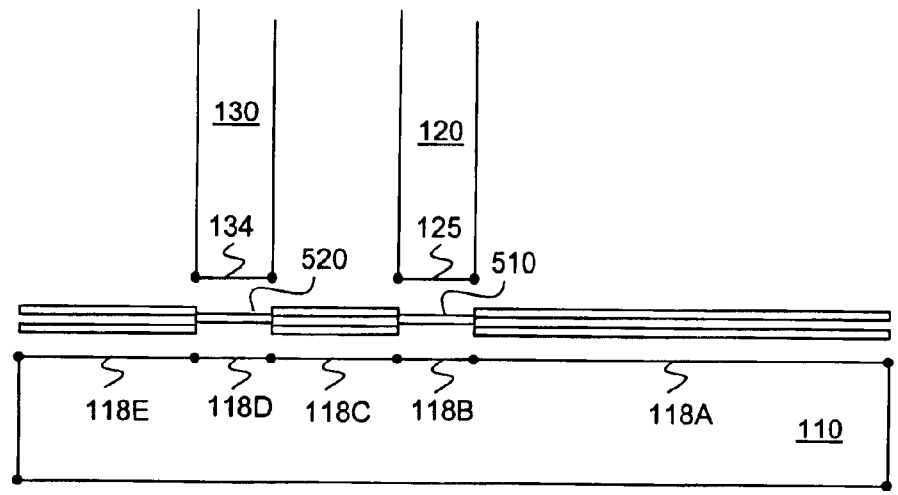
FIG. 5 illustrates a section of the exemplary design without smoothing.
Figure 6:
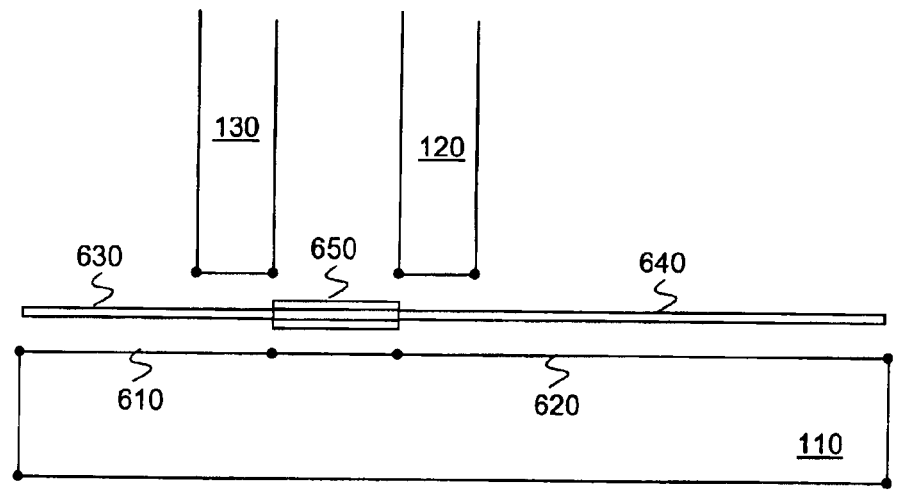
FIG. 6 illustrates a section of the exemplary design with smoothing, giving priority to closer spacing.
Figure 7:
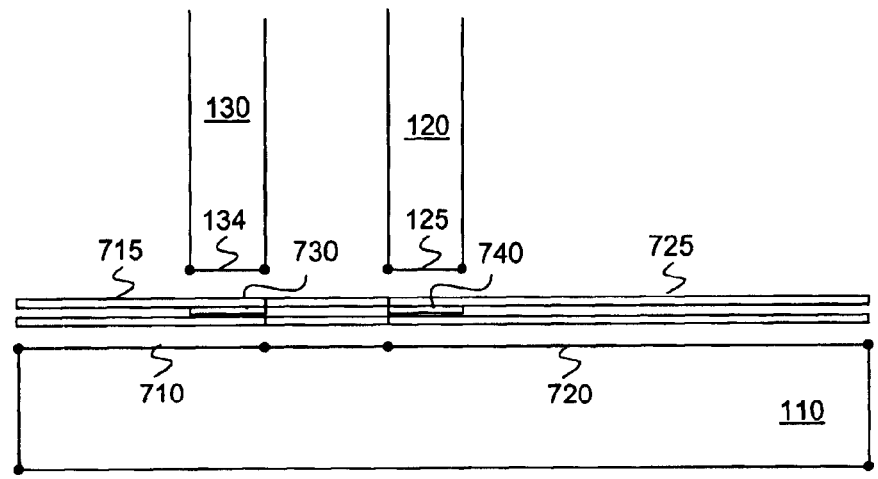
FIG. 7 illustrates a section of the exemplary design with smoothing, giving priority to farther spacing.

Examples of this smoothing process are shown using FIGS. 5, 6, and 7. FIG. 5 focuses on the areas between feature 110 and features 120 and 130 from FIG. 2 in which scatter bars have been added without any smoothing of target edges. Scatter bars 510 and 520 are centered between pairs of edges 118B and 125, and between 118D and 134, respectively. The scatter bars are shorter than the minimum scatter bar length 140 and will require some attention in a subsequent clean-up process. Rather than relying entirely on clean-up processing however, smoothing could be used first.

FIG. 6 shows the same area as FIG. 5 but after performing a smoothing process like the one described in FIG. 4 with priority given to the closer spacing classification. The original target edges 118D and 118B had closer spacing classes than the original collinear edges 118E, 118C, and 118A. Therefore, when the target edges were merged into the neighboring collinear edges, the resulting edges 610 and 620 adopted the spacing classifications of 118D and 118B, and received single scatter bars 630 and 640, both of which are longer than the minimum scatter bar length 140.

In this case, smoothing the target edges reduced the number of illegal scatter bars, but changed the type of scatter bar enhancement over long sections of edges, formerly sections 118E and 118A. Presumably, single bars 630 and 640 will not improve the resolution of former sections 118E and 118A to the same extent as the original scatter bars. The change may or may not be problematic for a particular lithographic process.

Some clean-up processing will also be needed in FIG. 6 because the ends of scatter bars 630 and 640 are very close to scatter bars 650, likely in violation of the minimum spacing requirement around features. A clean-up process may correct the spacing violation by shortening, or pulling back, the ends of some of the scatter bars without reducing any of the bars to less than the minimum scatter bar length. As an alternative, some photolithographic processes allow "jogs" in scatter bars. That is, rather than pulling ends of the scatter bars back, a clean-up process may merge scatter bars by mating ends that are quite close.

FIG. 7 shows the same area as FIG. 5 but after performing a smoothing process like the one shown in FIG. 4 with priority given to the farther spacing classification. The resulting edges 710 and 720 adopted the spacing classifications of original collinear edges 118E and 118A, and received double scatter bars 715 and 725. In this case, however, eliminating the original target edges 118D and 118B may have created another problem. The edge fragments 125 and 134 still receive single scatter bars 730 and 740 centered between the features. The clean-up process will need to deal with scatter bars 730 and 740, and may simply delete them.

Figure 8:
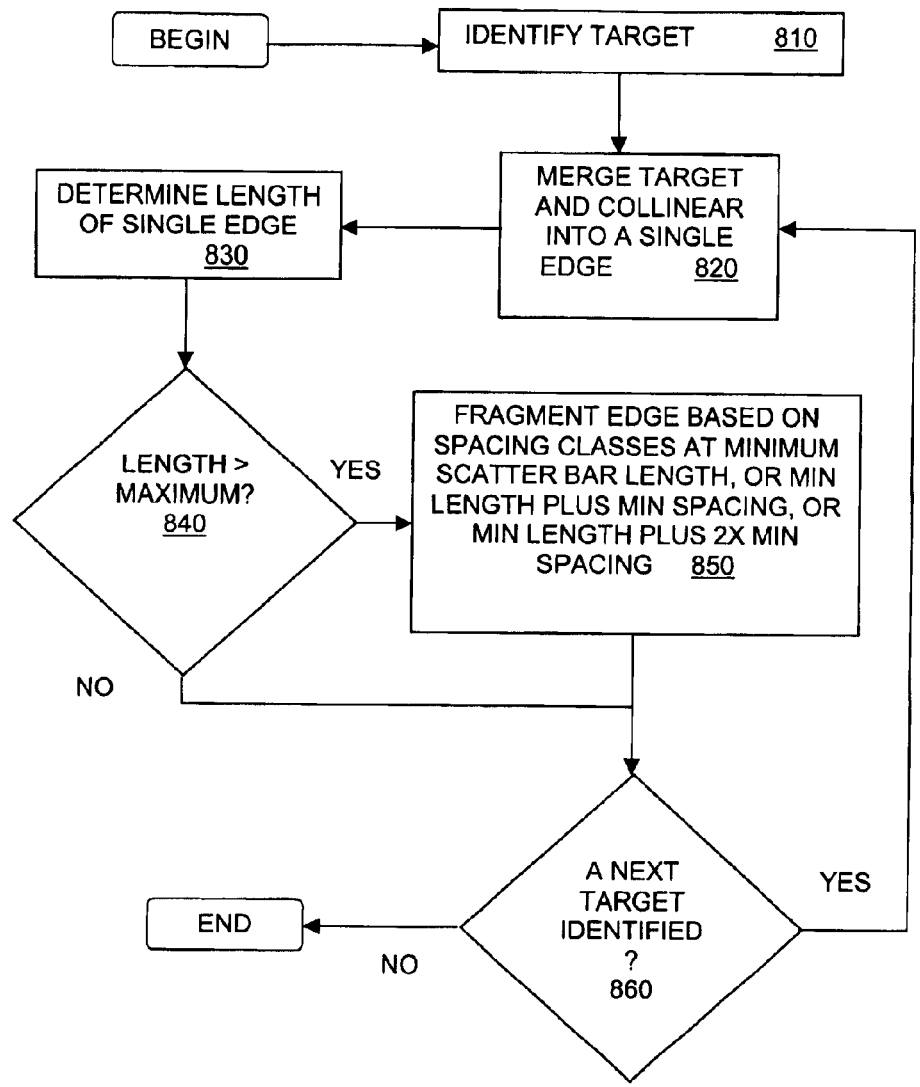
FIG. 8 demonstrates one embodiment of the present invention for re-fragmenting excessively long merged edges.

FIG. 8 demonstrates another embodiment of the present invention with an additional step to help deal with some of the issues raised in the examples of FIGS. 6 and 7. In FIG. 8, a target edge is identified at 810, and the target is merged with a collinear neighbor at 820 to form a single edge with priority given to the closest spacing, much like the previous example shown in FIG. 6. However, at 830, the illustrated process goes on to determine the length of the resulting edge. At 840, if the length of the merged edge is greater than a maximum bound for merged edges, the process fragments the edge back into two edges at 850. One edge fragment is assigned the classification of the original collinear neighbor, but its length is shorter than the original collinear neighbor. The other edge fragment is assigned the classification of the original target, but its length is longer than the original target.

In the illustrated embodiment, there are three possible lengths at which to fragment the merged edge—at the minimum scatter bar length, at the minimum scatter bar length plus the minimum spacing requirement, or at the minimum scatter bar length plus two times the minimum spacing requirement. The minimum spacing requirement is the minimum distance between features in the design. Other embodiments may use a wide variety of fragmentation lengths with the goal being to provide edges that are at least as long as the minimum scatter bar length but shorter than the maximum merged edge length. In one embodiment, the fragmentation length and maximum merged edge length are user defined. In another embodiment, the fragmentation length and maximum merged edge length are predefined based on design criteria and processing constraints.

After re-fragmenting the merged edge, the process checks to see if another target edge is identified at 460. If another target is identified, the process loops back to 440 to smooth the next target. Otherwise, the process ends. Similarly, back at 840, if the length of the merged edge is less than a maximum length for merged edges, the process skips the re-fragmenting step and goes straight to 460 to check for another target.

Figure 9:
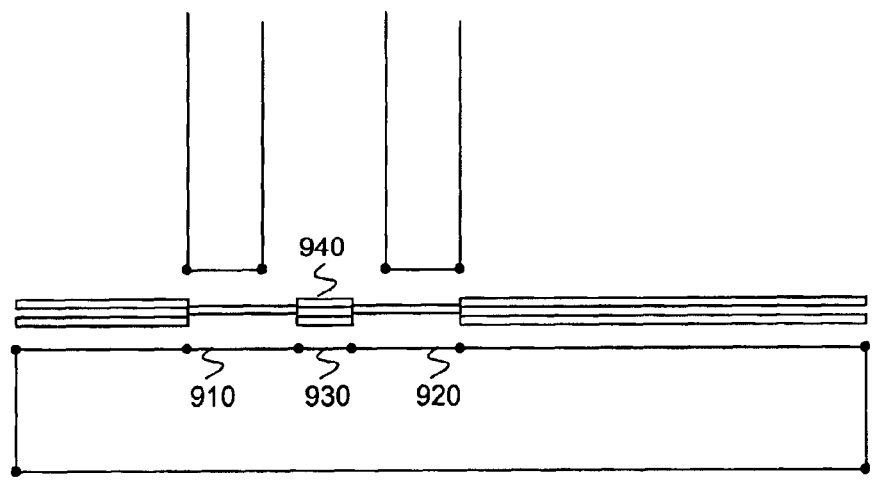
FIG. 9 illustrates a section of the exemplary design following re-fragmentation.

An example of this smoothing process is shown in FIG. 9. In FIG. 9, the original target edges 118D and 118B have been eliminated. And, rather than reclassifying long edge lengths, as was the case in FIG. 6, the long merged edges have been re-fragmented to limit the extent to which the edges are reclassified.

FIG. 9, however, illustrates another potential complication. In the illustrated example, rather than merging with the original collinear edges 118A and 118E, the target edges 118D and 118B were merged with collinear edge 118C. That is, when newly fragmented edges 910 and 920 where formed, the newly fragmented edge 930 was substantially shortened compared to the original edge 118C. Edge 930 is shorter than the minimum scatter bar length 140. In which case, although two illegal edges where eliminated, a third illegal set of scatter bars 940 were created.

Figure 10:
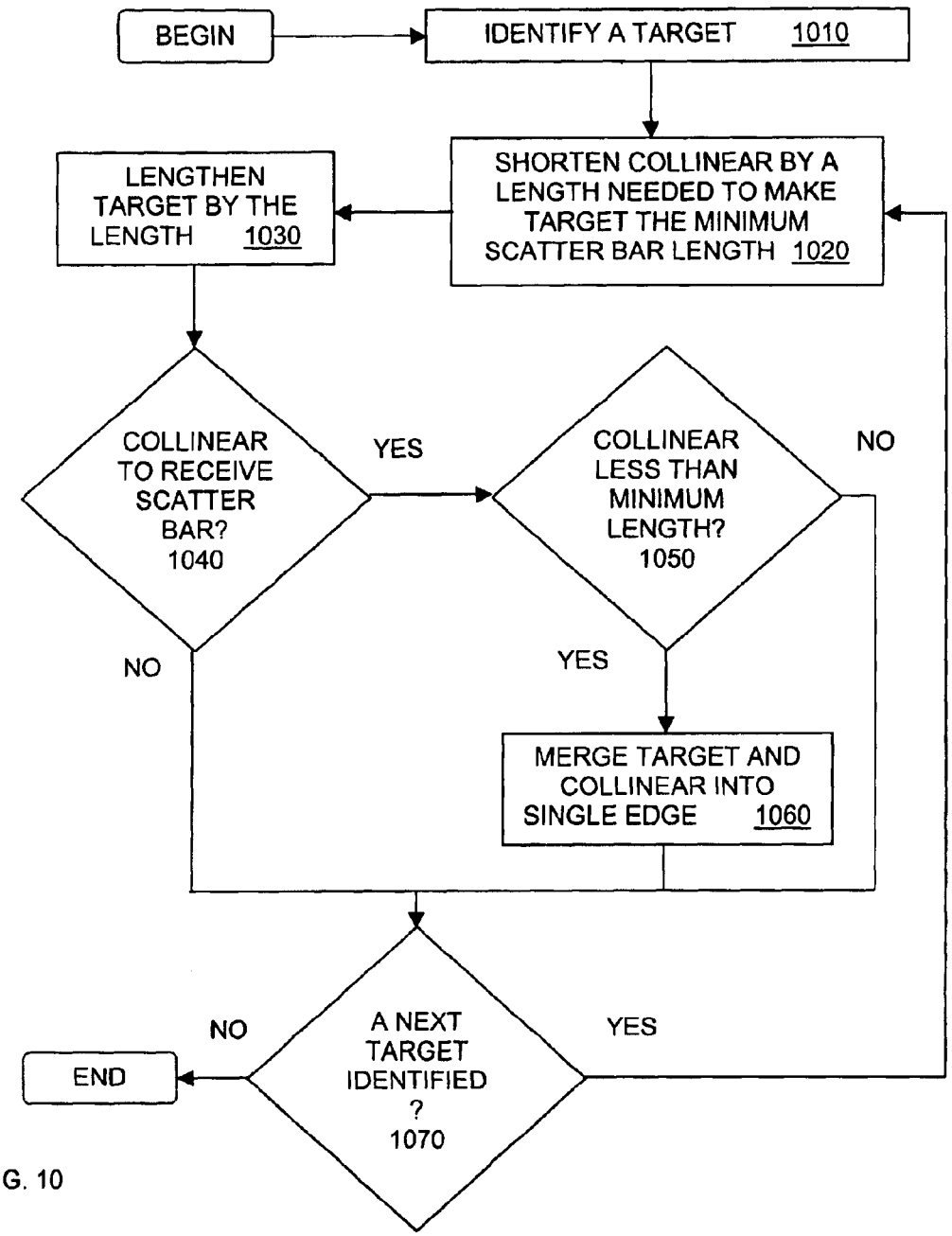
FIG. 10 demonstrates one embodiment of the present invention for merging following expansion.

FIG. 10 demonstrates another embodiment of the present invention with an additional step to help deal with the issues raised in the example of FIG. 9. In FIG. 10, the process identifies a target at 1010. A collinear edge is shorted at 1020 and the target is lengthened at 1030 by an equal amount to make the target the minimum scatter bar length. These steps could be performed in many different ways, including the merging and re-fragmenting process described in FIG. 8. Alternatively, the process could determine the length of the target, subtract the length of the target from the minimum scatter bar length, shorten the collinear neighbor by the resulting amount, and add the resulting amount to the target. In GDSII data, shortening, lengthening, merging, and fragmenting are all simply a matter of adding, deleting, or modifying points.

After adjusting the lengths of the target and collinear edges, the process determines at 1040 if the collinear edge has a classification to receive a scatter bar. If yes, the process determines at 1050 if the shortened collinear edge has a length less than the minimum scatter bar length. If yes, the shortened collinear edge is merged with the target at 1060. If the collinear edge was shortened as part of a merging and re-fragmenting process, such as the process described in FIG. 8, this step may actually be a re-merger of the two edges. And, as discussed above, merging can be done based on classification priority so that either the target adopts the classification of the collinear edge, or the collinear edge adopts the classification of the target edge.

After merging at 1060, or if the collinear edge does not have a classification to receive a scatter bar at 1040, or if the collinear edge is at least as long as the minimum scatter bar length at 1050, the process checks for an additional target edge at 1070 and loops back to 1020 if another target is identified. If another target is not identified at 1070, the process ends.

An alternative to the embodiment of FIG. 10 is to determine if the collinear edge has a classification to receive a scatter bar before shortening the edge. If the collinear edge is to receive a scatter bar, the process could expand the target edge into the collinear edge in increments and measure the length of the collinear edge at each increment. If the collinear edge drops down to the minimum scatter bar length, the process can then merge the collinear edge into the target edge.

Figure 11:
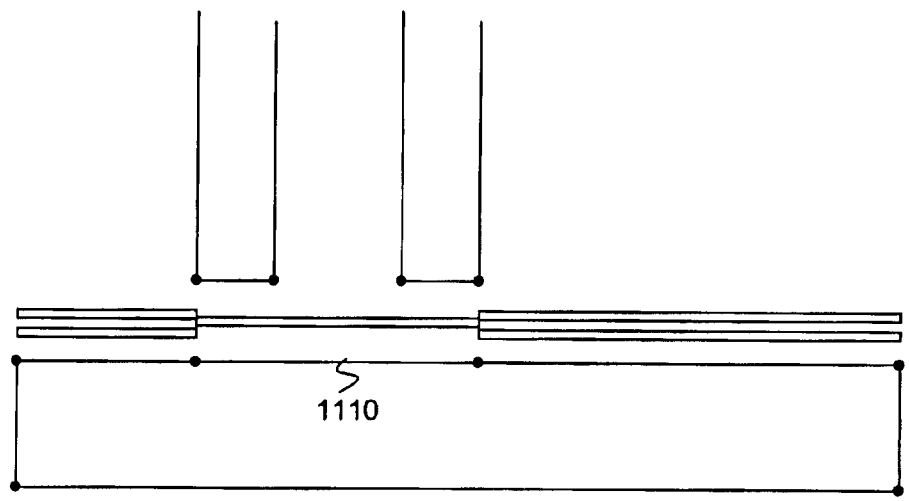
FIG. 11 illustrates a section of the exemplary design with merging following expansion.

FIG. 11 illustrates one possible outcome from the process of FIG. 10. In FIG. 11, edges 910, 920, and 930 from FIG. 9 have all been merged into a single edge 1110. Again, some clean-up will likely be needed to handle the close proximity of the scatter bar ends. Most likely, the scatter bars will either be pulled back to some extent, or, if jogs are permitted, the scatter bars may be merged at their ends with jogs.

Figure 12:
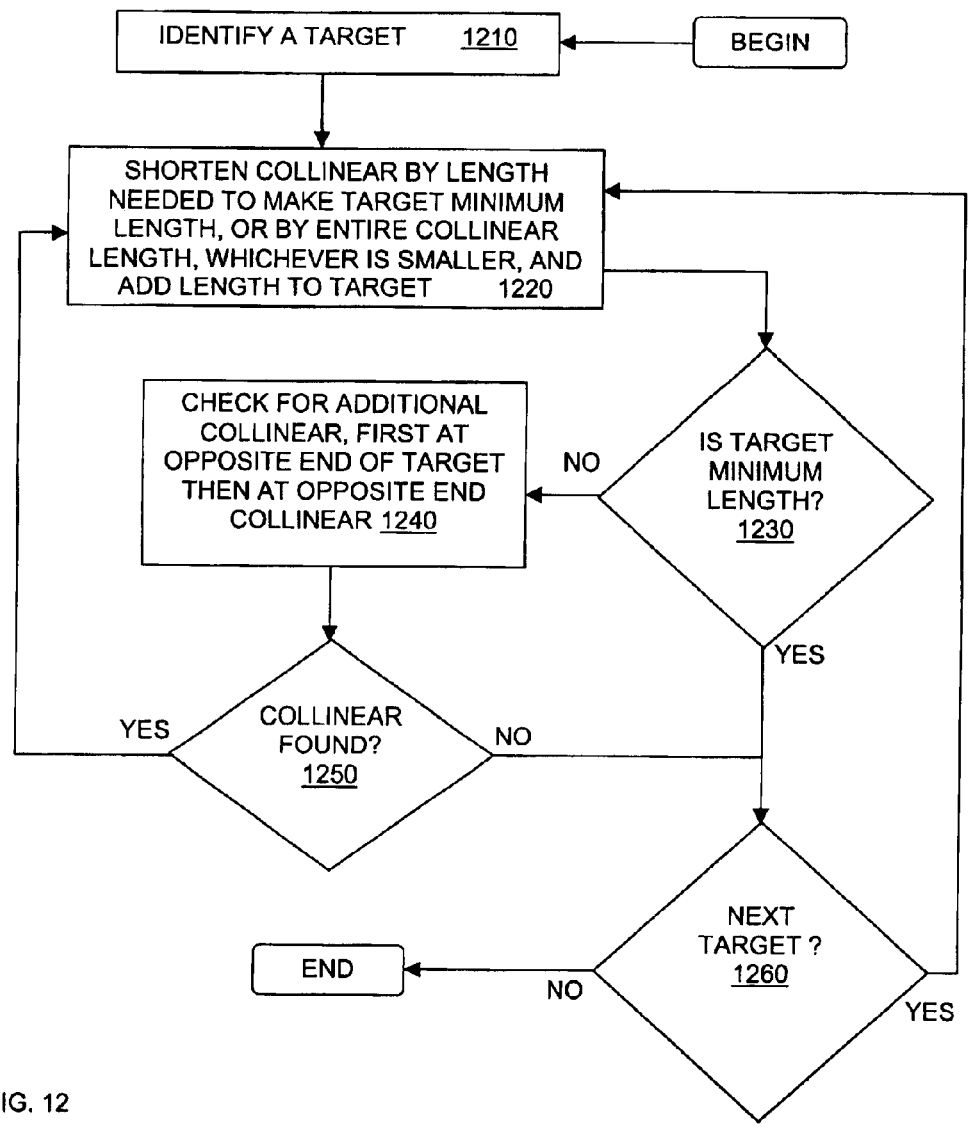
FIG. 12 demonstrates one embodiment of the present invention for smoothing over multiple collinear edges.

FIG. 12 illustrates another embodiment of the present invention to combine multiple edge fragments. At 1210, a target edge is identified. At 1220, a length is taken from a collinear neighbor and added to the target. The length is enough to make the target equal to or greater than the minimum scatter bar length, or the length is the entire collinear neighbor, whichever is smaller. If the length of the target is still less than the minimum scatter bar length at 1230, the process checks for an additional collinear edge. In the illustrated embodiment, the process first checks the end of the target edge opposite from the previous collinear edge. If no edge is found there, the process checks the end of the previous collinear edge opposite from the target edge. Other embodiments may check for an additional collinear edge in the opposite order.

At 1250, if an additional collinear edge is found, the process returns to 1220 to add part or all of the additional collinear edge to the target edge. The process will continue looping until the target is at least the minimum scatter bar length at 1230 or until no additional collinear edges are found at 1250. In either case, the process checks at 1260 for another target edge and either returns to 1220 to process the next target edge or ends.

Figure 13:
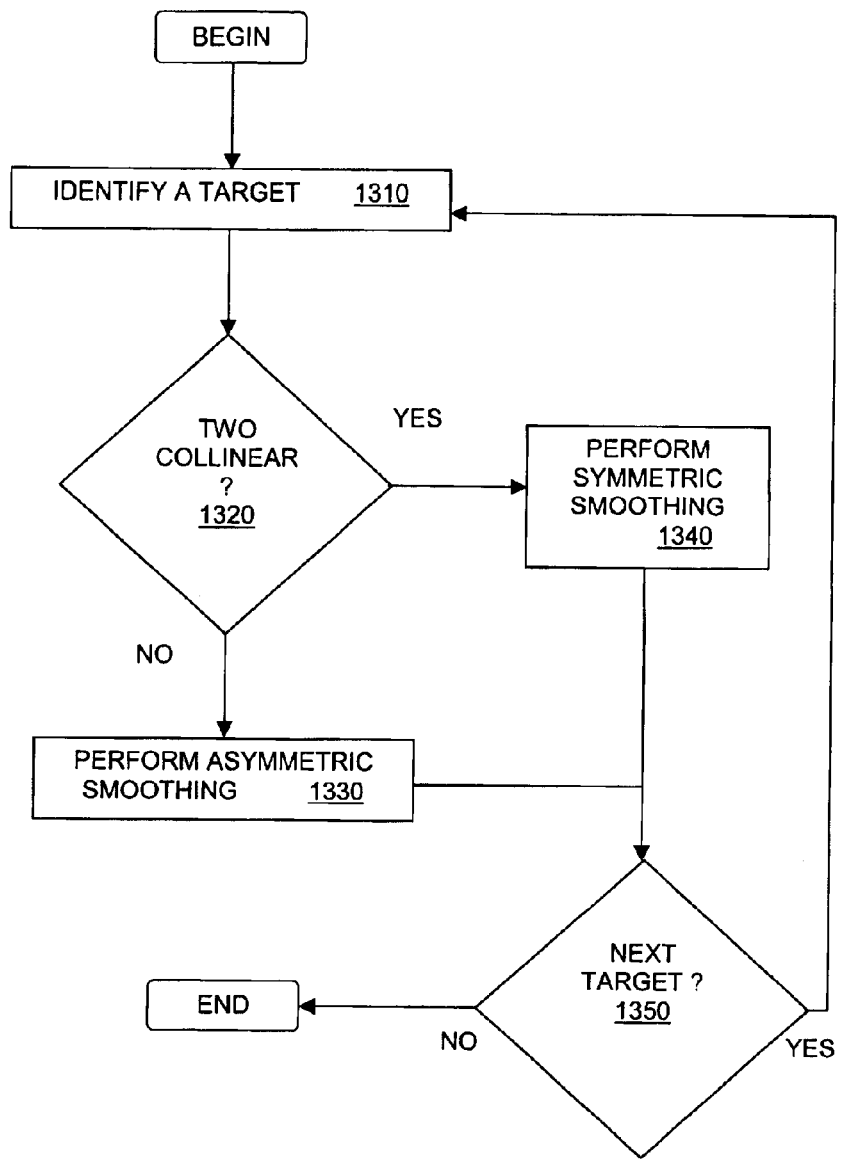
FIG. 13 demonstrates one embodiment of the present invention for symmetric or asymmetric smoothing.

FIG. 13 illustrates another embodiment of the present invention to accommodate potentially more than one collinear, neighbor edge. At 1310, the process identifies a target edge. At 1320, the process determines if the target edge has a second collinear neighbor so that there is one collinear neighbor at each end of the target edge. If no, the process performs asymmetric smoothing at 1330, merging or expanding from one end of the target edge as described above. If yes, however, the process performs symmetric smoothing at 1340, merging in both directions or expanding in both directions. In other words, rather than merging the target and one neighbor into a single edge, the illustrated embodiment merges the target and neighbors on both ends into a single edge. Or, rather than taking a length from one neighbor and adding the length to the target, the illustrated embodiment takes a length from both neighbors and adds both lengths to the target. Symmetric smoothing, as used in this example, means adding length to the target at both ends, but the length added to each end of the target may or may not be the same depending on the lengths of the collinear neighbors.

Many of the smoothing functions described above with respect to a single collinear neighbor can similarly be applied to symmetric smoothing with two collinear neighbors. For instance, if the length of an edge symmetrically merged from three separate edges is too long, the edge may be re-fragmented into two or three edges. If the length of one collinear edge is entirely consumed by the target and the target is still too short, more length may be added from the other collinear edge and/or the process may look for additional collinear edges. Similarly, if one or both collinear edges are shorter than the minimum scatter bar length after lengths of the collinear edges are added to the target edge, the process may merge the shortened collinear edge(s) into the target. In yet another alternative, the process may start by symmetrically shortening both collinear edges. If, however, the length of a first collinear edge has a classification to receive a scatter and the length drops to the minimum scatter bar length, the process could discontinue shortening the first edge but continue to asymmetrically shorten the other edge.

Figure 14:
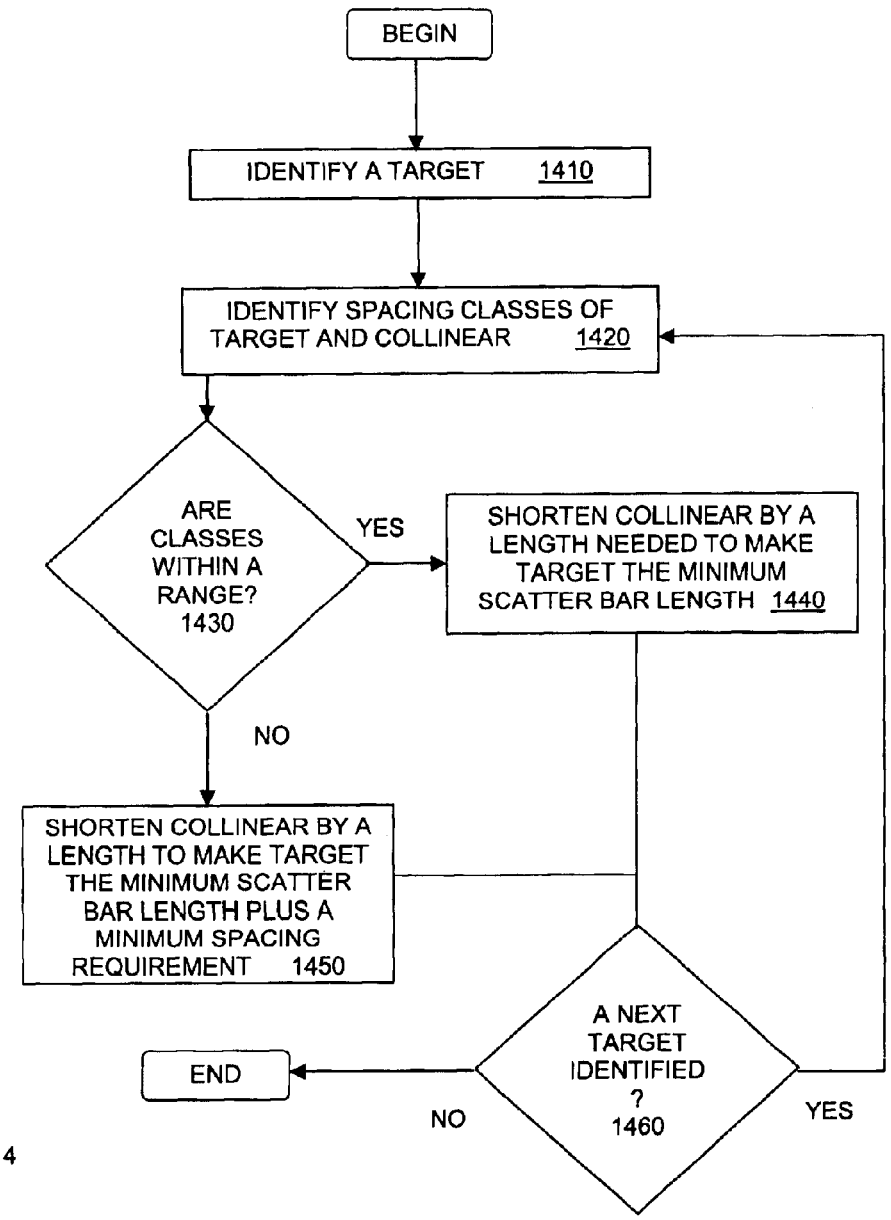
FIG. 14 demonstrates one embodiment of the present invention for variable target length based on relative edge classification.

FIG. 14 illustrates another embodiment of the present invention in which the type of smoothing used depends on the relative classifications of a target and its collinear edge. At 1410, a target edge is identified. At 1420, the spacing classifications of the target and its neighbor are identified. If the classifications are within a particular range of one another at 1430, the target edge expands into the collinear edge far enough for the target to reach the minimum scatter bar length at 1440. If, however, the classifications are not within the specified range from one another at 1430, the target edge expands farther into the collinear edge at 1450; far enough for the target edge to reach the minimum scatter bar length plus a minimum spacing requirement. At 1470, the process checks for an additional target edge in the design and either ends or returns to 1420 to process the next target.

Figure 15:
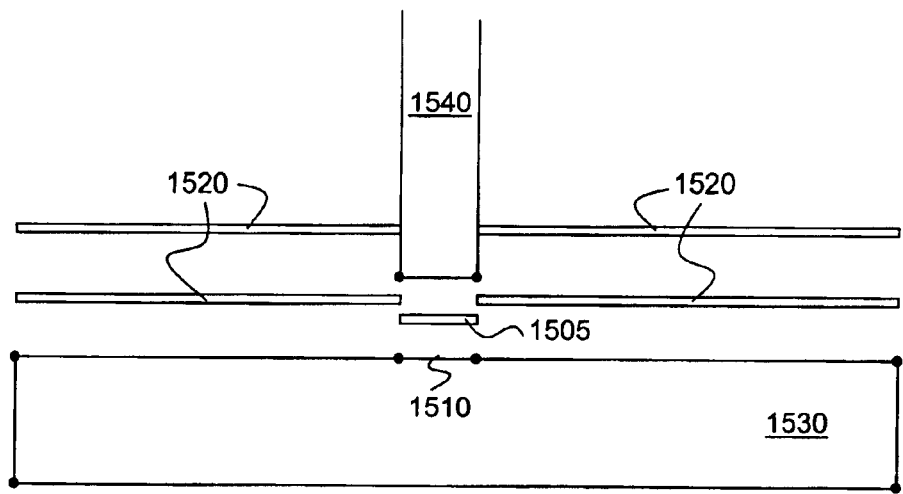
FIG. 15 illustrates an exemplary design where a target length greater than the minimum scatter bar length is desirable.

In the embodiment of FIG. 14, the size of the target edge after smoothing depends on the relative relationship of the spacing classifications for the target edge and its collinear neighbor. This process is useful in a couple of situations. For instance, as illustrated in FIG. 15, a target edge 1510 has a close spacing classification with a scatter bar 1505 centered between the features 1530 and 1540. Each of the target's collinear neighbors have an isolated spacing classification with scatter bars 1520 that extend too close to feature 1540, violating the minimum spacing require between features. Lengthening target edge 1510 to the minimum scatter bar length may still leave scatter bars 1520 too close to feature 1540. By recognizing this type of situation based on spacing classifications, the embodiment of FIG. 14 can add a margin to target edge 1510 beyond the minimum scatter bar length to increase the separation between scatter bars 1520 and feature 1540. In other words, clean-up processing is simplified in FIG. 15 not only because an illegal scatter bar is eliminated, but also because scatter bars 1520 will not have spacing violations.

Figure 16:
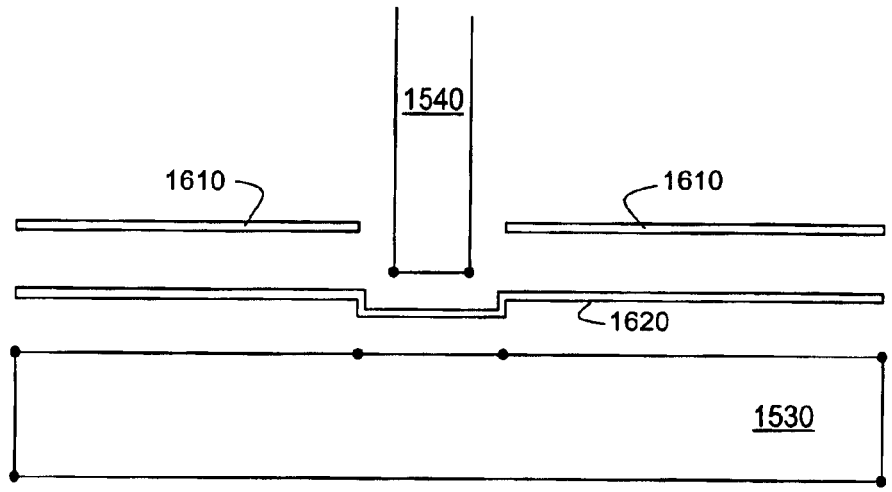
FIG. 16 illustrates the exemplary design of FIG. 15 with a longer target scatter bar length.

FIG. 16 illustrates one possible outcome following this type of smoothing and clean-up. Smoothing eliminated the illegal scatter bar and ensured that scatter bars 1610 did not violate the minimum spacing required around feature 1540. Clean-up added jogs to merge three scatter bars into 1620.

Figure 17:
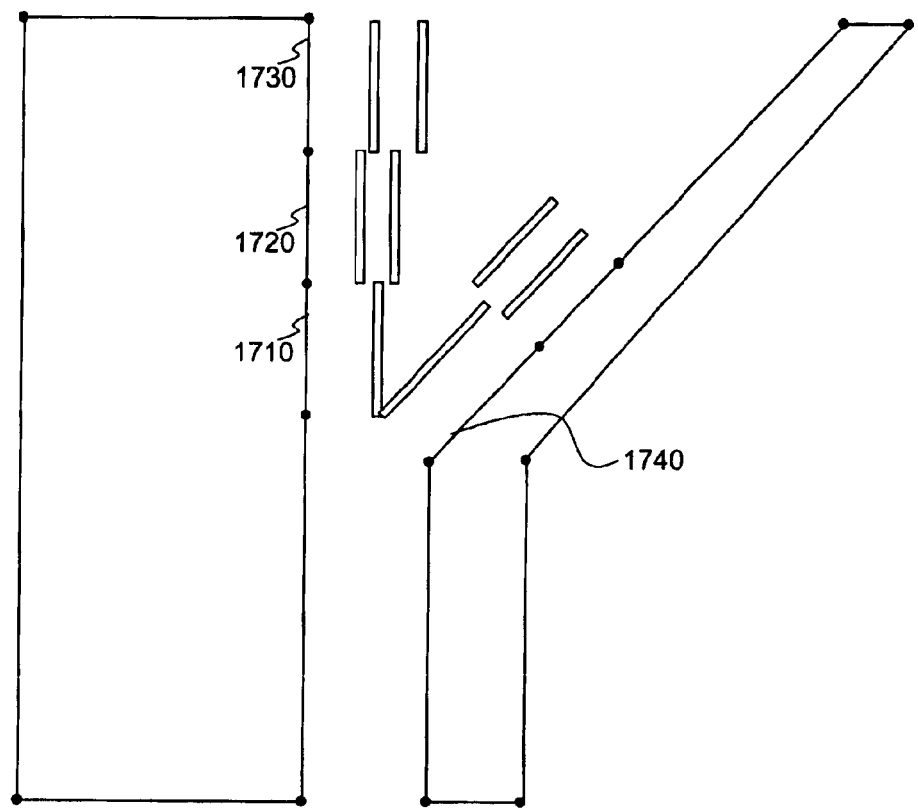
FIG. 17 illustrates an exemplary design where a target length equal to the minimum scatter bar length is desirable.

FIG. 17 illustrates another situation where smoothing may choose a scatter bar length based on edge classification. Target edges 1710, 1720, and 1730 all of have spacing classifications that are close to the spacing classifications of their collinear neighbors. Adding a margin of length over the minimum scatter bar length may not provide any benefit in this situation. Moreover, in the illustrated situation, the type of scatter bar enhancement is more likely to closely match to the actual spacing situation with shorter edge lengths. In which case, the smoothing process is likely to use the minimum scatter bar length for spacing classifications that are close to one another.

Other embodiments may include a wide variety of available scatter bar lengths. Appropriate situations for the variety of lengths can then be identified based on classification comparisons.

Figure 18:
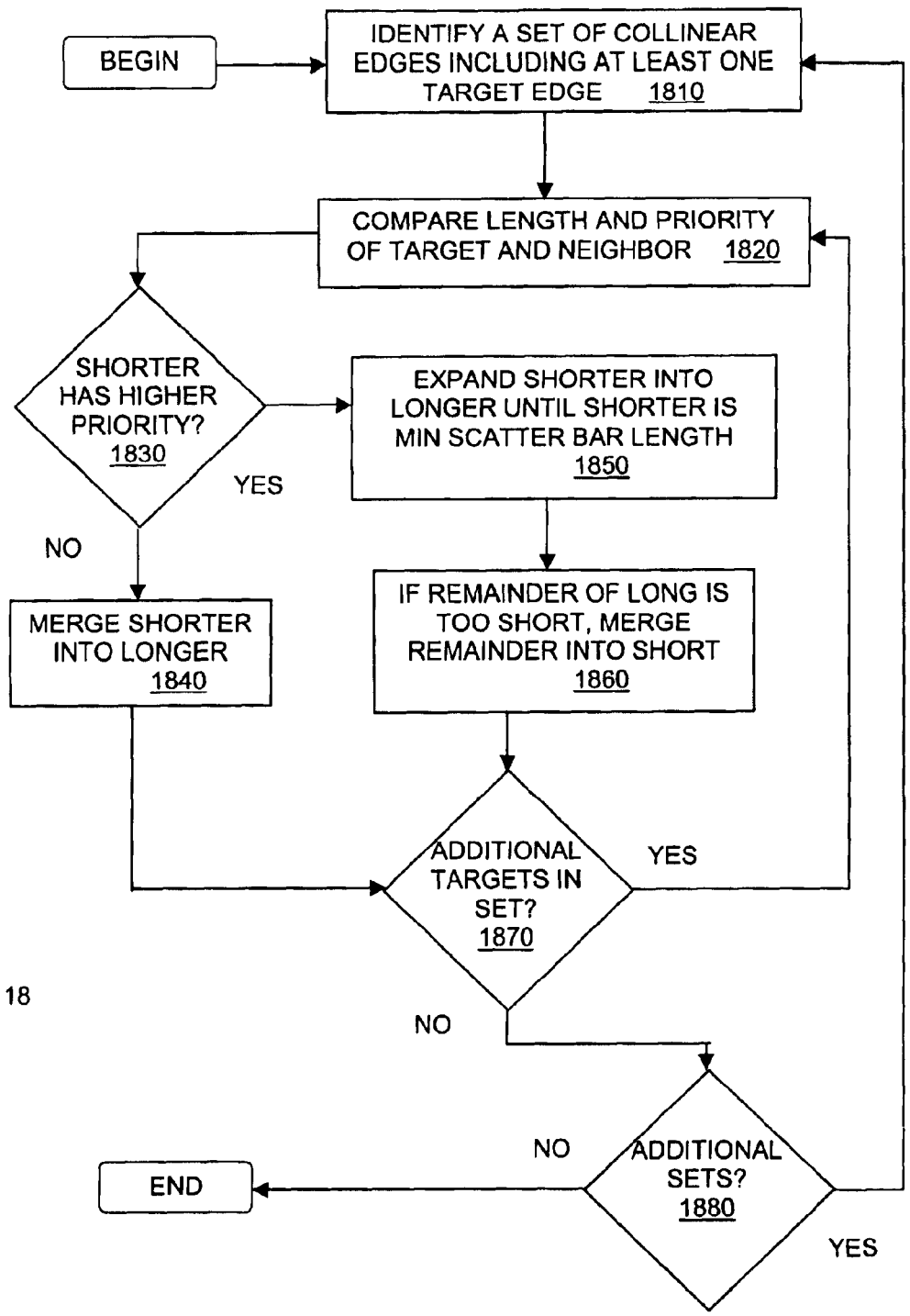
FIG. 18 demonstrates one embodiment of the present invention combining various smoothing techniques.

FIG. 18 illustrates one embodiment of the present invention that combines certain features of the smoothing techniques described above. Other embodiments may combine the various smoothing techniques of the present invention in any number of ways.

In FIG. 18, at 1810, the process identifies a set of collinear edges in a feature, at least one edge in the set of edges being a target edge having a length less than the minimum scatter bar length and a classification to receive a scatter bar. At 1820, the process selects a target edge from the set of edges and compares the target edge to one of its neighbors in the set of collinear edges. Each edge has a length and a priority value. At 1830, if the shorter edge of the two has a lower priority, the smoothing process merges the shorter edge into the longer edge at 1840.

If, however, the shorter edge has a higher priority at 1830, the smoothing process expands the shorter edge at 1850 into the longer edge until the shorter edge reaches the end of the longer edge or the shorter edge reaches the minimum scatter bar length, whichever happens first. Then, assuming the longer edge has a classification to receive a scatter bar, the remainder, if any, of the longer edge is compared to the minimum scatter bar length at 1860, and merged into the higher priority edge if the remainder is too short.

Once the target has been smoothed, either through 1840 or 1850 and 1860, the process checks at 1870 to see if there are additional targets in the set. If yes, the process returns to 1820. If no, the process checks for additional sets having at least one target at 1880. If there are no additional sets, the process ends. If there are additional sets, the process returns to 1810.

Each of the above illustrated embodiments includes various implementation specific details. Alternative embodiments may not include all of the illustrated elements, may perform the illustrated elements in different orders, may combine or separate one or more of the illustrated elements, and may include additional elements. Furthermore, many of the elements can be described in different, yet functionally equivalent, terms.

Figure 19:
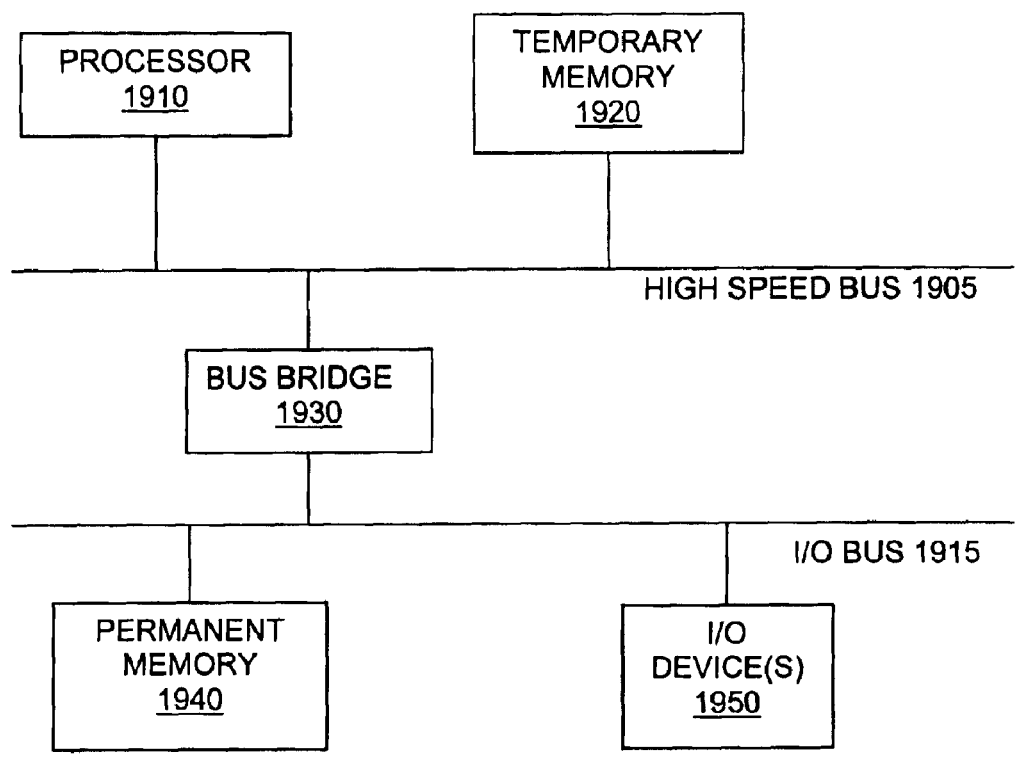
FIG. 19 illustrates one embodiment of a hardware system to implement embodiments of the present invention.

FIG. 19 illustrates one embodiment of a hardware system intended to represent a broad category of computer systems such as personal computers, workstations, and/or embedded systems. In the illustrated embodiment, the hardware system includes processor 1910 coupled to high speed bus 1905, which is coupled to input/output (I/O) bus 1915 through bus bridge 1930. Temporary memory 1920 is coupled to bus 1905. Permanent memory 1940 is coupled to bus 1915. I/O device(s) 1950 is also coupled to bus 1915. I/O device(s) 1950 may include a display device, a keyboard, one or more external network interfaces, etc.

Certain embodiments may include additional components, may not require all of the above components, or may combine one or more components. For instance, temporary memory 1920 may be on-chip with processor 1910. Alternately, permanent memory 1940 may be eliminated and temporary memory 1920 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, is implemented using one or more hardware systems such as the hardware system of FIG. 19. Where more than one computer is used, the systems can be coupled to communicate over an external network, such as a local area network (LAN), an internet protocol (IP) network, etc. In one embodiment, the present invention is implemented as software routines executed by one or more execution units within the computer(s). For a given computer, the software routines can be stored on a storage device, such as permanent memory 1940.

Figure 20:
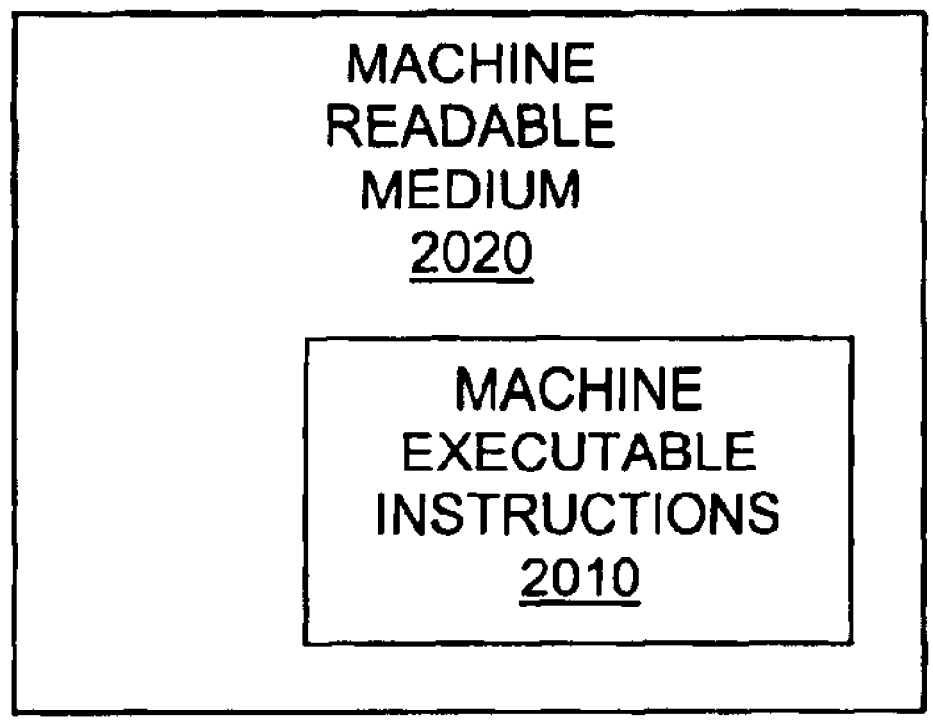
FIG. 20 illustrates one embodiment of a machine-readable medium to store executable instructions for embodiments of the present invention.

Alternately, as shown in FIG. 20, the software routines can be machine executable instructions 2010 stored using any machine readable storage medium 2020, such as a diskette, CD-ROM, magnetic tape, digital video or versatile disk (DVD), laser disk, ROM, Flash memory, etc. The series of instructions need not be stored locally, and could be received from a remote storage device, such as a server on a network, a CD ROM device, a floppy disk, etc., through, for instance, I/O device(s) 1950 of FIG. 19.

From whatever source, the instructions may be copied from the storage device into temporary memory 1920 and then accessed and executed by processor 1910. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with one or more of the above described functions of the present invention. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, short edge smoothing for enhanced scatter bar placement is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
   identifying a target edge fragment among a plurality of edge fragments comprising a feature in a photolithographic design, each of the plurality of edge fragments having a length and a classification, and said target edge fragment having a length less than a minimum scatter bar length, a classification to receive a scatter bar, and a collinear edge fragment; and
   smoothing the target edge fragment in conjunction with the collinear edge fragment to increase the length of the target edge fragment.

2. The method of claim 1 wherein each classification comprises one of a plurality of spacing classifications.

3. The method of claim 1 further comprising:
   identifying a plurality of additional target edge fragments in the photolithographic design, each of the plurality of additional target edge fragments having a collinear edge fragment, a classification to receive a scatter bar, and a length less than the minimum scatter bar length; and
   smoothing each of the additional target edge fragments in conjunction with respective collinear edge fragments to increase the lengths of each of the additional target edge fragments.

4. The method of claim 1 wherein smoothing the target edge fragment comprises:
   merging the target edge fragment and the collinear edge fragment into a single edge fragment.

5. The method of claim 4 further comprising:
   classifying the single edge fragment with a higher priority classification between the classification of the target edge fragment and a classification of the collinear edge fragment.

6. The method of claim 5 wherein one of the collinear edge fragment and the target edge fragment has a closer spacing classification, the method further comprising:
   using the closer spacing classification for the higher priority classification.

7. The method of claim 5 wherein one of the collinear edge fragment and the target edge fragment has a farther spacing classification, the method further comprising:
   using the farther spacing classification for the higher priority classification.

8. The method of claim 5 wherein the collinear edge fragment has a classification to receive a scatter bar, the method further comprising:
   using the classification between the target edge fragment and the collinear edge fragment that would receive a closer scatter bar as the higher priority classification.

9. The method of claim 1 wherein smoothing the target edge fragment comprises:
   shortening the collinear edge fragment by an amount; and
   lengthening the target edge fragment by the amount.

10. The method of claim 9 further comprising:
    determining that the collinear edge fragment has a classification to receive a scatter bar;
    determining a length of the collinear edge fragment after shortening;
    merging the collinear edge fragment and the target edge fragment into a single edge fragment if the length of the collinear edge fragment is less than the minimum scatter bar length.

11. The method of claim 9 wherein shortening comprises:
    identifying the classification of the target edge fragment;
    identifying a classification of the collinear edge fragment;
    if the classifications of the target edge fragment and the collinear edge fragment are within a particular range relative to one another, determining the amount such that the length of the target edge fragment will be the minimum scatter bar length;
    if the classifications of the target edge fragment and the collinear edge fragment are not within the particular range relative to one another, determining the amount such that the length of the target edge fragment will be a longer length than the minimum scatter bar length.

12. The method of claim 11 wherein the longer length is the minimum scatter bar length plus a minimum spacing requirement between features in the photolithographic design.

13. The method of claim 11 wherein the classifications are not within the particular range if one classification is an isolated class and the other classification is a close class.

14. The method of claim 11 wherein the classifications are not within the particular range if one classification would place a scatter bar at a distance greater than a distance defined by the other spacing classification.

15. The method of claim 9 wherein, if the amount is equal to an entire length of the collinear edge fragment, smoothing the target edge fragment further comprises:
    determining a length of the target edge fragment after lengthening;
    if the length of the target edge fragment is still less than the minimum scatter bar length, checking for an additional collinear edge fragment;
    if an additional collinear edge fragment is found, incrementally smoothing the target edge fragment in conjunction with the additional collinear edge fragment;
    repeating the determining, checking, and incrementally smoothing until the length of the target edge fragment is at least the minimum scatter bar length or no additional collinear edge fragment is found.

16. The method of claim 15 wherein the collinear edge fragment is on a first end of the target edge fragment, and wherein checking for the additional collinear edge fragment comprises:

checking a second end of the target edge fragment first; and checking an opposite end of the collinear edge fragment second.

17. The method of claim 1 wherein the collinear edge fragment comprises a first collinear edge fragment on a first end of the target edge fragment, the target edge fragment further having a second collinear edge fragment at a second end of the target edge fragment.

18. The method of claim 17 wherein smoothing the target edge fragment comprises:

shortening the first edge fragment by a first amount;

shortening the second edge fragment by a second amount; and lengthening the target edge fragment by the first amount plus the second amount.

19. The method of claim 18 wherein at least one of the following is true:

the first amount and the second amount are equal;

the first amount and the second amount are unequal; and the first amount is zero.

20. The method of claim 18 further comprising:

determining that the first collinear edge fragment has a classification to receive a scatter bar;

determining a length of the first collinear edge fragment after shortening by the first amount; and merging the first collinear edge fragment and the target edge fragment into a single edge fragment if the length of the first collinear edge fragment is less than the minimum scatter bar length.

21. The method of claim 20 further comprising:

determining that the second collinear edge fragment has a classification to receive a scatter bar;

determining a length of the second collinear edge fragment after shortening by the second amount; and merging the second collinear edge fragment into the single edge fragment if the length of the second collinear edge fragment is less than the minimum scatter bar length.

22. The method of claim 17, wherein smoothing the target edge fragment comprises:

merging the first collinear edge fragment, the second collinear edge fragment, and the target edge fragment into a single edge fragment.

23. The method of claim 1 wherein the minimum scatter bar length comprises a plurality of minimum lengths, each of the plurality of minimum lengths corresponding to a particular spacing classification, and wherein the length of the target edge fragment is less than the minimum length for the corresponding spacing classification of the target edge fragment.

24. A method comprising:

identifying a set of collinear edge fragments among a plurality of edge fragments comprising a feature in a photolithographic design, at least one of said set of collinear edge fragments being a target edge fragment, each target edge fragment having a classification to receive a scatter bar and having a length less than a minimum scatter bar length; and smoothing the set of collinear edge fragments to increase the length of each target edge fragment.

25. The method of claim 24 wherein smoothing the set of collinear edge fragments comprises:

expanding each target edge fragment into at least one neighbor edge fragment within the set of collinear edge fragments.

26. The method of claim 24 wherein a given target edge fragment has a first neighbor edge fragment within the set of collinear edge fragments at a first end and a second neighbor edge fragment within the set of collinear edge fragments at a second end, and wherein smoothing the set of collinear edge fragments comprises:

symmetrically expanding the given target edge fragment into both the first and second neighbor edge fragments.

27. The method of claim 24 wherein a given target edge fragment has a first neighbor edge fragment within the set of collinear edge fragments at a first end and a second neighbor edge fragment within the set of collinear edge fragments at a second end, and wherein smoothing the set of collinear edge fragments comprises:

asymmetrically expanding the given target edge fragment to a greater extent into one of the first and second neighbor edge fragments than the other of the first and second neighbor edge fragments.

28. The method of claim 27 wherein asymmetrically expanding the given target edge fragment comprises:

determining lengths for the first and second neighbor edge fragments as the given target edge fragment expands into the first and second neighbor edge fragments;

discontinuing expansion into either the first or second neighbor edge fragment if the length of the respective neighbor edge fragment reaches the minimum scatter bar length.

29. The method of claim 24 wherein smoothing comprises:

selecting a given target edge fragment from among the set of collinear edge fragments;

comparing the length of the given target edge fragment to a length of a neighbor edge fragment;

if a shorter edge fragment among the given target edge fragment and the neighbor edge fragment has a lower priority, merging the shorter edge fragment and a longer edge fragment into a single edge fragment; and if the shorter edge fragment has a higher priority, expanding the shorter edge fragment into the longer edge fragment until the length of the shorter edge fragment is at least the minimum scatter bar length.

30. The method of claim 29 wherein smoothing further comprises:

determining a remaining length of the longer edge fragment after expanding the shorter edge fragment; and merging the remaining length of the longer edge fragment into the shorter edge fragment if the remaining length is less than the minimum scatter bar length.

31. A machine readable medium having stored thereon machine executable instructions that when executed implement a method comprising:

identifying a target edge fragment among a plurality of edge fragments comprising a feature in a photolithographic design, each of the plurality of edge fragments having a length and a classification, and said target edge fragment having a length less than a minimum scatter bar length, a classification to receive a scatter bar, and a collinear edge fragment; and smoothing the target edge fragment in conjunction with the collinear edge fragment to increase the length of the target edge fragment.

32. The machine readable medium of claim 31 wherein smoothing the target edge fragment comprises:

merging the target edge fragment and the collinear edge fragment into a single edge fragment.

33. The machine readable medium of claim 32 wherein the method further comprises:

classifying the single edge fragment with a higher priority classification between the classification of the target edge fragment and a classification of the collinear edge fragment.

34. The machine readable medium of claim 33 wherein one of the collinear edge fragment and the target edge fragment has a closer spacing classification, the method further comprising:

using the closer spacing classification for the higher priority classification.

35. The machine readable medium of claim 33 wherein one of the collinear edge fragment and the target edge fragment has a farther spacing classification, the method further comprising:

using the farther spacing classification for the higher priority classification.

36. The machine readable medium of claim 33 wherein the collinear edge fragment has a classification to receive a scatter bar, the method further comprising:

using the classification between the target edge fragment and the collinear edge fragment that would receive a closer scatter bar as the higher priority classification.

37. The machine readable medium of claim 31 wherein smoothing the target edge fragment comprises:

shortening the collinear edge fragment by an amount; and lengthening the target edge fragment by the amount.

38. The machine readable medium of claim 37 wherein the method further comprises:

determining that the collinear edge fragment has a classification to receive a scatter bar;

determining a length of the collinear edge fragment after shortening;

merging the collinear edge fragment and the target edge fragment into a single edge fragment if the length of the collinear edge fragment is less than the minimum scatter bar length.

39. The machine readable medium of claim 37 wherein shortening comprises:

identifying the classification of the target edge fragment;

identifying a classification of the collinear edge fragment;

if the classifications of the target edge fragment and the collinear edge fragment are within a particular range relative to one another, determining the amount such that the length of the target edge fragment will be the minimum scatter bar length;

if the classifications of the target edge fragment and the collinear edge fragment are not within the particular range relative to one another, determining the amount such that the length of the target edge fragment will be a longer length than the minimum scatter bar length.

40. The machine readable medium of claim 37 wherein, if the amount is equal to an entire length of the collinear edge fragment, smoothing the target edge fragment further comprises:

determining a length of the target edge fragment after lengthening;

if the length of the target edge fragment is still less than the minimum scatter bar length, checking for an additional collinear edge fragment;

if an additional collinear edge fragment is found, incrementally smoothing the target edge fragment in conjunction with the additional collinear edge fragment;

repeating the determining, checking, and incrementally smoothing until the length of the target edge fragment is at least the minimum scatter bar length or no additional collinear edge fragment is found.

41. The machine readable medium of claim 40 wherein the collinear edge fragment is on a first end of the target edge fragment, and wherein checking for the additional collinear edge fragment comprises:

checking a second end of the target edge fragment first; and checking an opposite end of the collinear edge fragment second.

42. The machine readable medium of claim 31 wherein the collinear edge fragment comprises a first collinear edge fragment on a first end of the target edge fragment, the target edge fragment further having a second collinear edge fragment at a second end of the target edge fragment.

43. The machine readable medium of claim 42 wherein smoothing the target edge fragment comprises:

shortening the first edge fragment by a first amount;

shortening the second edge fragment by a second amount; and lengthening the target edge fragment by the first amount plus the second amount.

44. The machine readable medium of claim 43 wherein the method further comprises:

determining that the first collinear edge fragment has a classification to receive a scatter bar;

determining a length of the first collinear edge fragment after shortening by the first amount; and merging the first collinear edge fragment and the target edge fragment into a single edge fragment if the length of the first collinear edge fragment is less than the minimum scatter bar length.

45. The machine readable medium of claim 44 wherein the method further comprises:

determining that the second collinear edge fragment has a classification to receive a scatter bar;

determining a length of the second collinear edge fragment after shortening by the second amount; and merging the second collinear edge fragment into the single edge fragment if the length of the second collinear edge fragment is less than the minimum scatter bar length.

46. The machine readable medium of claim 42, wherein smoothing the target edge fragment comprises:

merging the first collinear edge fragment, the second collinear edge fragment, and the target edge fragment into a single edge fragment.

47. A machine readable medium having stored thereon machine executable instructions that when executed implement a method comprising:

identifying a set of collinear edge fragments among a plurality of edge fragments comprising a feature in a photolithographic design, at least one of said set of collinear edge fragments being a target edge fragment, each target edge fragment having a classification to receive a scatter bar and having a length less than a minimum scatter bar length; and smoothing the set of collinear edge fragments to increase the length of each target edge fragment.

48. The machine readable medium of claim 47 wherein smoothing the set of collinear edge fragments comprises:

expanding each target edge fragment into at least one neighbor edge fragment within the set of collinear edge fragments.

49. The machine readable medium of claim 47 wherein a given target edge fragment has a first neighbor edge fragment within the set of collinear edge fragments at a first end and a second neighbor edge fragment within the set of collinear edge fragments at a second end, and wherein smoothing the set of collinear edge fragments comprises:

symmetrically expanding the given target edge fragment into both the first and second neighbor edge fragments.

50. The machine readable medium of claim 47 wherein a given target edge fragment has a first neighbor edge fragment within the set of collinear edge fragments at a first end and a second neighbor edge fragment within the set of collinear edge fragments at a second end, and wherein smoothing the set of collinear edge fragments comprises:

asymmetrically expanding the given target edge fragment to a greater extent into one of the first and second neighbor edge fragments than the other of the first and second neighbor edge fragments.

51. The machine readable medium of claim 50 wherein asymmetrically expanding the given target edge fragment comprises:

determining lengths for the first and second neighbor edge fragments as the given target edge fragment expands into the first and second neighbor edge fragments;

discontinuing expansion into either the first or second neighbor edge fragment if the length of the respective neighbor edge fragment reaches the minimum scatter bar length.

52. The machine readable medium of claim 47 wherein smoothing comprises:

selecting a given target edge fragment from among the set of collinear edge fragments;

comparing the length of the given target edge fragment to a length of a neighbor edge fragment;

if a shorter edge fragment among the given target edge fragment and the neighbor edge fragment has a lower priority, merging the shorter edge fragment and a longer edge fragment into a single edge fragment; and if the shorter edge fragment has a higher priority, expanding the shorter edge fragment into the longer edge fragment until the length of the shorter edge fragment is at least the minimum scatter bar length.

53. The machine readable medium of claim 52 wherein smoothing further comprises:

determining a remaining length of the longer edge fragment after expanding the shorter edge fragment; and merging the remaining length of the longer edge fragment into the shorter edge fragment if the remaining length is less than the minimum scatter bar length.

54. An apparatus comprising:

means for identifying a target edge fragment among a plurality of edge fragments comprising a feature in a photolithographic design, each of the plurality of edge fragments having a length and a classification, and said target edge fragment having a length less than a minimum scatter bar length, a classification to receive a scatter bar, and a collinear edge fragment; and means for smoothing the target edge fragment in conjunction with the collinear edge fragment to increase the length of the target edge fragment.

55. An apparatus comprising:

means for identifying a set of collinear edge fragments among a plurality of edge fragments comprising a feature in a photolithographic design, at least one of said set of collinear edge fragments being a target edge fragment, each target edge fragment having a classification to receive a scatter bar and having a length less than a minimum scatter bar length; and means for smoothing the set of collinear edge fragments to increase the length of each target edge fragment.

* * * * *